(12) United States Patent
Lim et al.

(10) Patent No.: US 6,784,009 B2
(45) Date of Patent: Aug. 31, 2004

(54) ELECTRODE PATTERNING IN OLED DEVICES

(75) Inventors: Hooi Bin Lim, Penang (MY); Hagen Klausmann, Penang (MY); Bernd Fritz, Penang (MY)

(73) Assignee: Osram Opto Semiconductors (Malaysia) SDN BHD, Bayan Lepas (MY)

( * ) Notice: Subject to any disclaimer, the term of this patent is extended or adjusted under 35 U.S.C. 154(b) by 0 days.

(21) Appl. No.: 10/064,983

(22) Filed: Sep. 6, 2002

(65) Prior Publication Data

US 2003/0096446 A1 May 22, 2003

Related U.S. Application Data

(63) Continuation-in-part of application No. 09/989,363, filed on Nov. 20, 2001, now Pat. No. 6,699,728.

(51) Int. Cl.⁷ .............................................. H01L 21/00
(52) U.S. Cl. .............................. 438/39; 438/24; 438/99; 438/608; 438/609; 438/780; 438/782; 438/440

(58) Field of Search ................................ 438/24, 39, 99, 438/608, 609, 780, 782, 440, 443, FOR 135, FOR 416, FOR 491, FOR 492; 313/506; 430/200

(56) References Cited

U.S. PATENT DOCUMENTS

| | | | |
|---|---|---|---|
| 5,701,055 A | 12/1997 | Nagayama et al. | 313/504 |
| 5,952,778 A | 9/1999 | Haskal et al. | 313/504 |
| 5,962,970 A | 10/1999 | Yokoi et al. | 313/506 |
| 6,111,356 A * | 8/2000 | Roitman et al. | 313/506 |
| 6,373,187 B1 * | 4/2002 | Nagayama et al. | 313/506 |
| 2001/0000744 A1 * | 5/2001 | Wolk et al. | 430/200 |
| 2001/0017516 A1 | 8/2001 | Gonther | 313/504 |

* cited by examiner

Primary Examiner—George Fourson
Assistant Examiner—Julio J. Maldonado
(74) Attorney, Agent, or Firm—Dexter Chin

(57) ABSTRACT

An OLED device having pillars with cross section that is wider on the top. The pillars structure a conductive layer during deposition into distinct portions located between the pillars and on the top of the pillars. In one embodiment, the grooves between the pillars extend outside the electrode region to prevent shorting of adjacent electrodes.

27 Claims, 13 Drawing Sheets

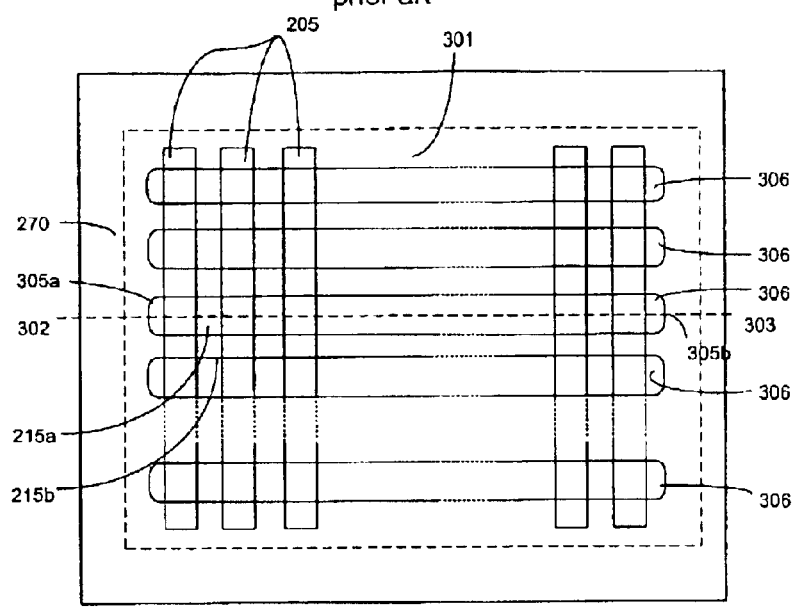

ELECTRODE PATTERNING IN OLED DEVICES

CROSS REFERENCE TO RELATED APPLICATIONS

This application is a continuation-in-part of patent application titled "Improved Patterning of Electrodes in OLED Devices with Shaped Pillars", U.S. Ser. No. 09/989,363 filed Nov. 20, 2001 now U.S. Pat. No. 6,699,728, which is herein incorporated by reference for all purposes.

BACKGROUND OF INVENTION

FIG. 1 shows a conventional pixelated OLED device 100. Pixelated OLED devices can be used as displays in various consumer electronic products, including cellular phones, cellular smart phones, personal organizers, pagers, advertising panels, touch screen displays, teleconferencing and multimedia products, virtual reality products, and display kiosks.

Typically, the OLED device comprises a functional stack of one or more organic functional layers 110 between a transparent conductive layer 105 and a conductive layer 115. The functional stack is formed on a transparent substrate 101. The conductive layers are patterned to form rows of cathodes in a first direction and columns of anodes in a second direction. OLED pixels are located where the cathodes and anodes overlap. Bond pads 150 are coupled to the cathodes and anodes to control the OLED pixels. A cap 160, which forms a cavity 145 between it and the pixels, encapsulates the device to protect the OLED pixels from the environment such as moisture and/or air.

In operation, charge carriers are injected through the cathodes and anodes for recombination in the functional layers. The recombination of the charge carriers causes the functional layer of the pixels to emit visible radiation.

To provide a display with high resolution and high filling factor, the spacing between pixels should be small, for example, about less than 50 $\mu$m. The spacing between the pixels is defined by the patterning processes that form the cathodes and anodes. Various conventional patterning techniques have been used to form the cathodes, such as shadow masking, photolithography (with wet or dry etching), laser ablation, or lift-off techniques (wet or dry resists). However, conventional patterning techniques are not fully compatible or feasible for fabricating OLEDs. For example, photolithographic techniques employ chemicals which damage the organic functional layers or cathode materials. With shadow masking or lift-off techniques (wet resists as well as dry resist foils), high resolutions (e.g., less than 50 $\mu$m) are difficult to achieve, particularly in a manufacturing or production environment.

As evidenced from the above discussion, it is desirable to provide a patterning technique to pattern a conductive layer which achieves high resolutions without damaging already deposited materials.

SUMMARY OF INVENTION

The invention relates generally to the fabrication of devices such as OLED devices. More particularly, the invention relates to the patterning of a conductive layer. In one embodiment, pillars with an undercut (e.g., cross-section which is wider on top) are provided. In one embodiment, grooves between the pillars extend outside the electrode region to prevent shorting of adjacent electrodes. In another embodiment, the grooves extend to the edges of the substrate. The tapered profile of the pillars patterns the conductive layer into distinct first and second portions during deposition.

BRIEF DESCRIPTION OF DRAWINGS

FIGS. 3a–b show a top view and a cross-sectional view of a conventional OLED device;

DETAILED DESCRIPTION

Figure 1:
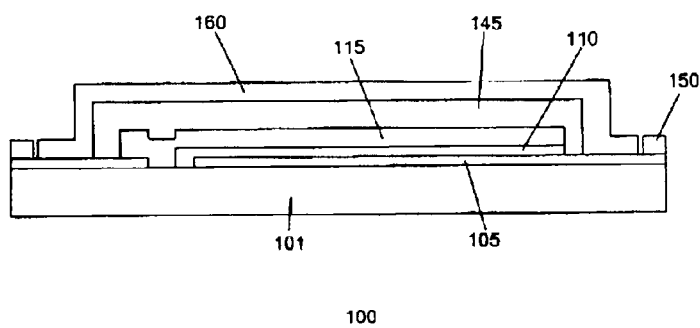
FIG. 1 shows a conventional OLED device.
Figure 2:
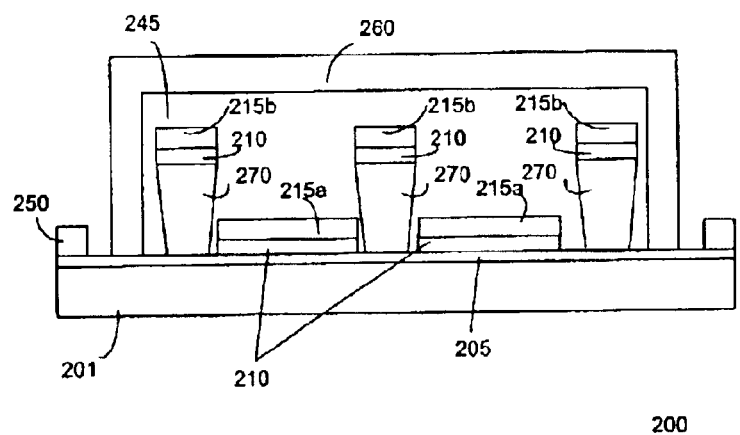
FIG. 2 shows an embodiment of the invention.

FIG. 2 shows an OLED device 200 in accordance with one embodiment of the invention. The OLED device comprises a substrate 201 on which pixels are formed in the active region. In one embodiment, the substrate comprises a transparent substrate, such as glass. To form flexible devices, materials such as plastics, can be used. Other types of materials that can serve as a substrate to support the OLED pixels are also useful. The OLED pixels comprise one or more organic layers 210 sandwiched between first and second electrodes 205 and 215. In one embodiment, the first electrodes 205 are anodes and the second electrodes 215 are cathodes. Forming first electrodes that are cathodes and second electrodes that are anodes is also useful. The cathodes and anodes are formed as strips in respective first and second directions. Typically, the first and second directions are orthogonal to each other. The intersection of the first and second electrodes form OLED pixels. Bond pads 250 are electrically coupled to the cathodes and anodes. A cap 260 is provided to encapsulate the OLED pixels. The cap creates a cavity 245 to protect the pixels from being damaged by physical contact with the cap.

Pillars 270 are provided on the substrate surface. The pillars are arranged in a first direction. The height of the pillars extend above the functional stack (e.g., 1–10 $\mu$m), separating the cathodes and the organic functional layers into strips. In an alternative embodiment, the pillars can also extend the height of the cavity to serve as support structures for the cap 260. This is particularly useful for flexible OLED devices since the cap is prevented from contacting and damaging the pixels.

In one embodiment, the pillars include an undercut, which results in structures that are wider at the top than at the bottom. The undercut serves to pattern a conductive layer 215 during deposition to form distinct or separate portions 215a above the functional layers and portions 215b on the top of the pillars. The portions 215a in grooves between the pillars serve as, for example, cathodes. In one embodiment, the undercut is provided by forming pillars with a tapered profile. In one embodiment, first and second sidewalls of the pillars are tapered, producing pillars with a v-shaped cross-section. The taper angle is, for example, about 30–75 degrees from horizontal.

In one embodiment, the pillars are formed from a single device layer. Forming the pillars from a single layer advantageously reduces manufacturing cost. Since the chemicals, such as solvents for depositing the functional organic layer or layers can be corrosive, the pillars are formed from a material that maintains its integrity during processing. In one embodiment, the pillars are formed using a photosensitive material such as resist. The resist is treated by, for example, cross-linking, to render it inert to solvents. Other types of photosensitive materials, such as photosensitive polyimide or photosensitive polybenzosazole, are also useful. In addition, electron cure resist systems, such as those manufactured by Allied Signal, can also be used to form pillars having the desired cross-sectional shape.

Figure 3B:
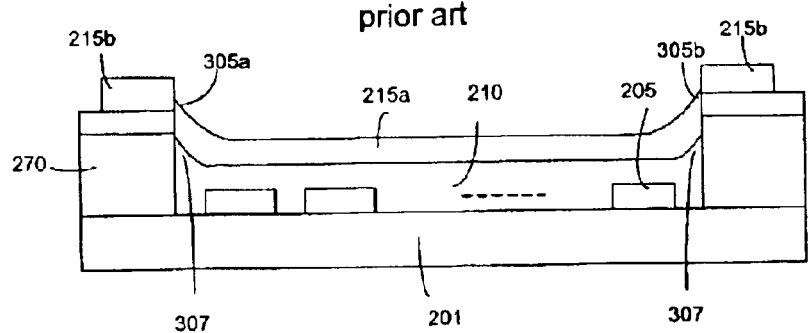

FIG. 3(a) shows a top view of a conventional OLED device after the respective layers are formed. FIG. 3(b) shows a cross-sectional profile of the OLED device through line 302–303. The second conductive layer 215 is deposited in the electrode region 301 to form pixels. The edge of the electrode region is, for example, at least 300 μm from the first pixel. The pillars 270 form grooves such as 306 to pattern the conductive layer into distinct portions 215a and 215b.

However, it is recognized that a problem exists if the grooves 306 are formed within the electrode region 301. Referring to FIG. 3(b), the cross-sectional profile of the resist layer 270 may be less tapered at the ends (305a and 305b) of the grooves, causing the organic material to accumulate at regions such as 307 during deposition. This undesirably leads to non-uniform illumination of the OLED device, where the regions around the groove ends are brighter. Moreover, the accumulation of organic material may cause the two portions (215a and 215b) of the second conductive layer to contact in regions such as 305a and 305b, resulting in electrical shorting of adjacent electrodes.

Figure 4A:
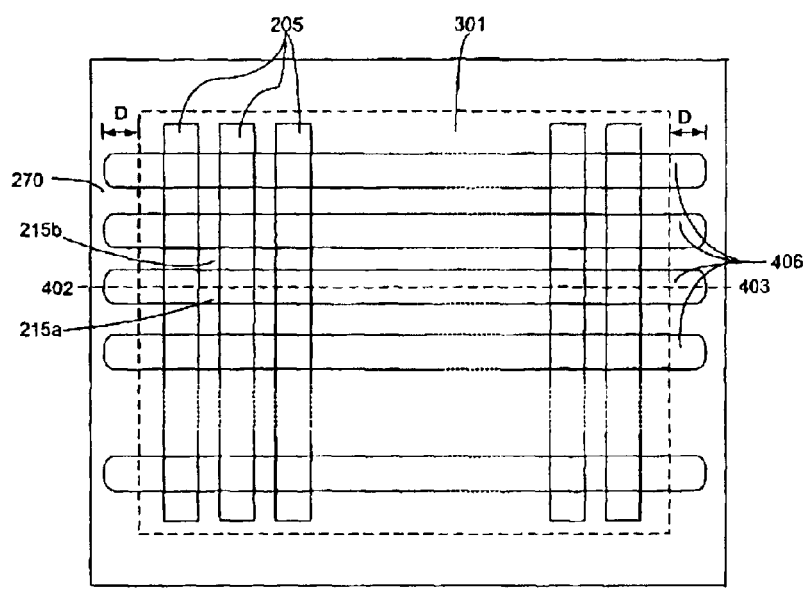
FIGS. 4a–b show a top view and a cross-sectional view of an OLED device in accordance to one embodiment of the invention.
Figure 4B:
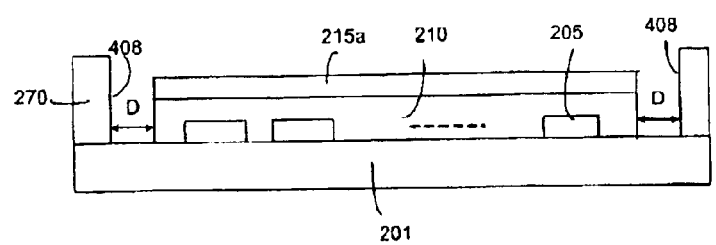

FIG. 4(a) shows a top view of a portion of an OLED device according to one embodiment of the invention. FIG. 4(b) shows a cross-sectional view of the OLED device through line 402–403. In accordance with one embodiment of the invention, the grooves 406 extend outside the electrode region 301 to prevent electrical shorting. In one embodiment, a distance D is provided between the edge of the electrode region 301 and the end of the grooves. In one embodiment, D is at least 300 μm. Since the conductive layer is not deposited over the groove ends 408, electrical shorting between adjacent electrodes is avoided. Hence, the reliability of the patterning process is improved and a uniform illumination of the OLED device is achieved.

Figure 5A:
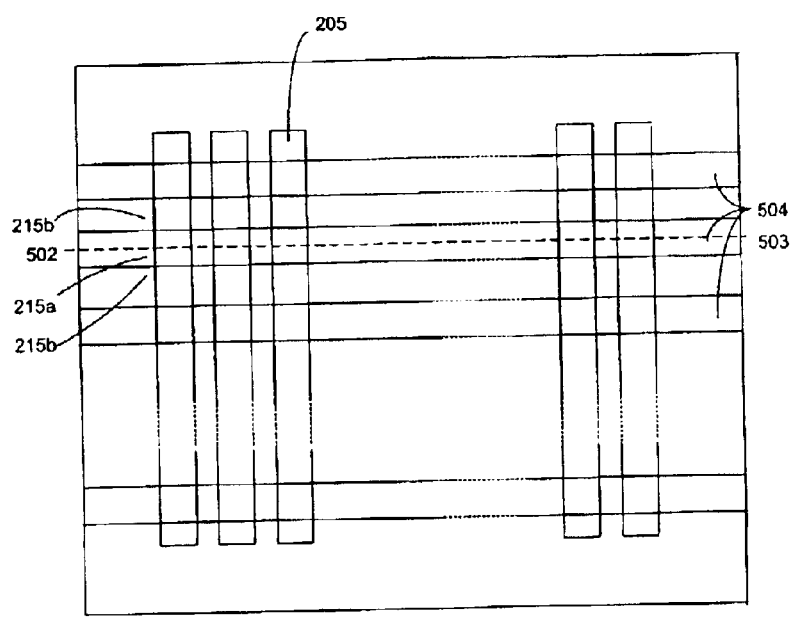
FIGS. 5a–b show a top view and a cross-sectional view of an OLED device in accordance to another embodiment of the invention.
Figure 5B:
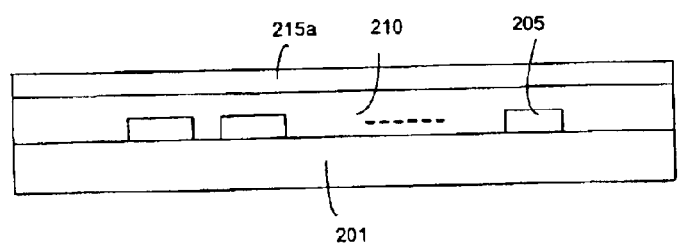

FIG. 5(a) shows a top view of a portion of an OLED device according to another embodiment of the invention. FIG. 5(b) shows a cross-sectional view of the OLED device through line 502–503. The pillars from grooves 504 which extend to the edges of the substrate. Since the cross-sectional profile of the pillars is almost uniform along the direction of line 502–503, the organic and conductive materials do not accumulate at the ends of the grooves. Therefore, the uniformity of illumination of the OLED device is improved and the probability of electrical shorting between adjacent electrodes is reduced.

Figure 6:
FIGS. 6–10 show a process for fabricating an OLED device in accordance with one embodiment of the invention.

FIGS. 6–10 show a process for fabricating an OLED device in accordance with one embodiment of the invention. Referring to FIG. 6, a substrate 601 is provided. In one embodiment, the substrate comprises a transparent substrate, for example, soda lime or borosilicate glass. Other types of transparent materials can also be used to serve as the substrate. The substrate typically is about 0.4 1.1 mm thick.

In another embodiment, the substrate comprises a thin flexible substrate. Thin flexible substrates are formed from, for example, plastic films such as transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. Alternatively, materials such as ultra thin glass (e.g., thickness between 10–100 μm), a composite stack comprising glass and polymer or polymer films coated with inorganic barrier layers can also be used.

The substrate includes first electrodes 605 formed on the surface thereof. The first electrodes serve as, for example, anodes. The anodes are formed from a conductive material. In one embodiment, the conductive material comprises a transparent conductive material such as indium-tin-oxide (ITO). Other transparent conductive materials, for example, indium-zinc-oxide, zinc-oxide, tin-oxide, are also useful. In one embodiment, the anodes are arranged in strips in a second direction, the strips are being separated by spaces. Preferably, the space separating the anodes is less than 50 μm wide. Connections to bond pads can also be provided. Various techniques, such as photolithography, can be used to form the anodes.

Figure 7:
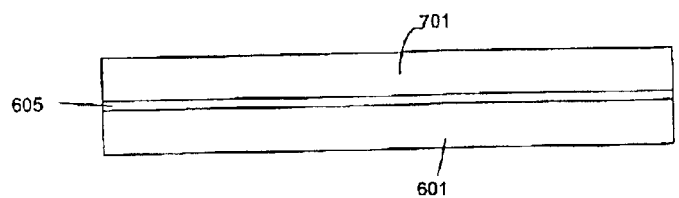

Referring to FIG. 7, a device layer 701 is deposited on the substrate. The device layer is used to create the pillars which facilitate patterning of a conductive layer to form the second electrodes (e.g., cathodes). The thickness of the device layer is equal to the height of the pillars. The thickness of the device layer is, for example, about 0.5–50 μm, preferably about 1–10 μm.

In one embodiment, the device layer comprises a negative acting photoresist such as AZ CTP 100R manufactured by Clariant. Other photosensitive materials can also be used. The resist is deposited on the substrate by, for example, spin-coating or roller-coating. After depositing the resist, the substrate is baked at, for example, 90° C. for about 2 minutes to remove the resist solvent.

Figure 8:
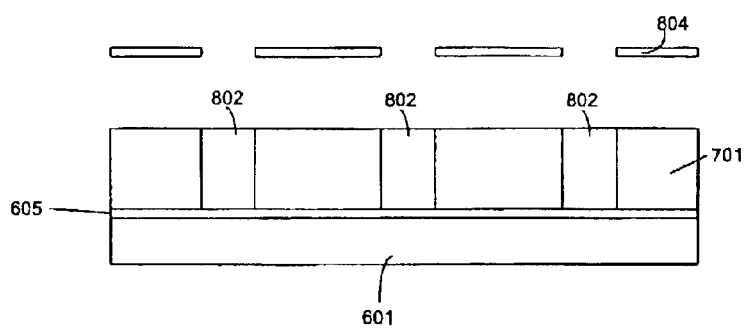

In FIG. 8, the device layer is selectively exposed to light from an exposure source through a mask 804. The exposure process is designed to form pillars with the desired undercut or tapered profile. The exposure process comprises, for example, successively exposing the photosensitive layer with electrons or charged particles having different energies which have different penetration depths to form the tapered profile during development. For a negative photosensitive layer, the exposure comprises selectively exposing the upper regions of the device layer with a lesser amount of energy than the lower regions. For a positive photosensitive layer, the exposure comprises selectively exposing the upper regions of the device layer with a greater amount of energy than the lower regions.

In one embodiment, a negative resist layer is selectively exposed with an exposure source. The exposure results in the upper portions of regions 802 absorbing a greater amount of light than the lower portions (i.e., underexposing the lower portions of regions 802). Regions 802 correspond to locations where pillars are to be formed. In one embodiment, the resist is exposed with I line radiation using a Karl Suess MJB 3 exposure source. The exposure dose is about 50 mJ/cm$^2$.

The resist is then prepared for development to remove the unexposed portions. The preparation, for a negative acting resist, includes a post-exposure bake to cross-link the resist in the exposed regions. The post-exposure bake is performed at, for example, about 120° C. for about 60–90 seconds. Cross-linking renders the resist insoluble to the resist development chemistry. After the post-exposure bake, the resist is subjected to a flood exposure from the exposure source (e.g. exposure without mask). The flood exposure renders the previously un-exposed portions of the resist soluble. The dose of the flood exposure is, for example, about 1000 mJ/cm$^2$.

Figure 9:
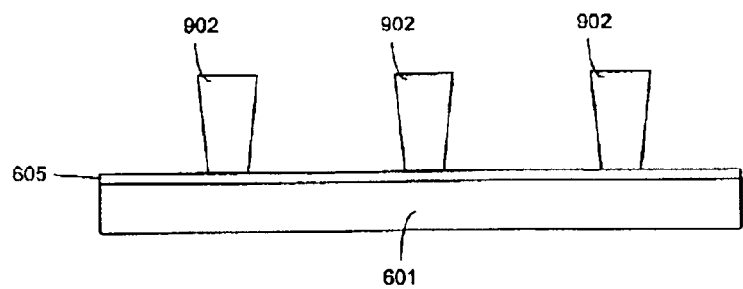

Referring to FIG. 9, the device layer is developed with a resist development chemistry to remove the unexposed regions, leaving pillars 902. In one embodiment, the resist chemistry comprises an alkaline developer such as A2 726 manufactured by Clariant. The resist is developed in the development chemistry at room temperature for about 60 seconds. Because the lower parts of the exposed regions were underexposed, they are more soluble to the resist chemistry. This creates pillars with an undercut, resulting in a cross-section that is narrower at the bottom than the top. The resist is then rinsed with de-ionized water to remove the developer.

After forming the pillars, the resist is cured to improve the mechanical stability of the pillars and to render pillars inert to the organic solvents used to form the functional organic layers. In one embodiment, the resist is cured by heating the substrate at a temperature of about 160° C. for about 6 hours. Other curing techniques such as electron beam (e-beam), particle (proton, alpha) or UV curing can also be used. After curing, the substrate is cleared by subjecting it to UV-0$_3$ for about 3 minutes, removing small organic residues on the exposed portions of the substrate.

Figure 10:
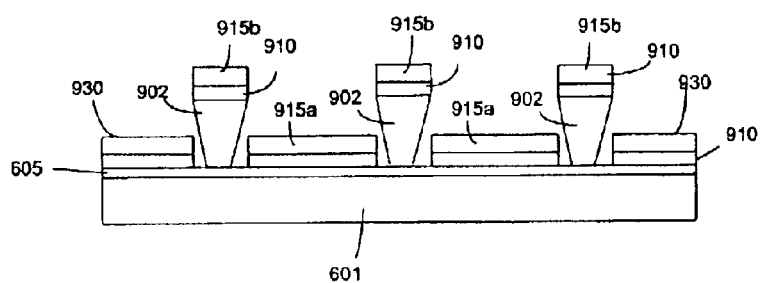

Referring to FIG. 10, a functional organic layer 910 is deposited on the substrate. In one embodiment, the functional organic layer comprises a conjugated polymer. The polymer is dissolved in a solvent and deposited by spin-coating techniques. In one embodiment, the organic functional layer comprises a 1% solution of electro-luminescent polymer dissolved in xylene deposited by spinning the substrate at 4000 rpm for about 30 seconds. Other wet deposition techniques are also useful. Such techniques, for example, include printing techniques (e.g., screen printing, off-set printing, ink-jet printing) in which the organic functional layer is dissolved in a solvent (e.g., NMP, or hexene). Depositing the organic functional layer by a wet process is advantageous as it is substantially self planarizing, resulting in the layer filling the area between the pillars with a substantially planar surface. The pillars, due to curing, are not adversely affected by the solvents. Additional functional layers can be deposited to form a functional organic stack. The thickness of the organic layer or stack is typically about 2 200 nm. After depositing the functional organic layer, the substrate is heated to a temperature of about 85° C. for about 1 minute to evaporate the solvent.

Portions of the organic layer can be selectively removed, for example, to expose underlying layers in regions 930 for bond pad connections. Selective removal of the organic layers can be achieved by a polishing process. Other techniques, such as etching, scratching, or laser ablation, can also be used to selectively remove portions of the organic layers.

A conductive layer 915 is deposited on the substrate. The conductive layer comprises, for example, Ca, Mg, Ba, Ag, Al or a mixture or alloy thereof. Other conductive materials, particularly those comprising a low work function, can also be used to form the second conductive layer. In one embodiment, the second conductive layer comprises Ca. The Ca is deposited by thermal evaporation at a rate of 1 nm/s and a pressure of about 10$^{-5}$ mbar. Other deposition techniques, such as sputtering (PVD), chemical vapor deposition (CVD), plasma enhanced chemical vapor deposition (PECVD) or metal organic chemical vapor deposition (MOCVD), are also useful.

The deposition of the conductive layer is interrupted due to the height and profile of the pillars, resulting in parts 915$a$ of the conductive layer being deposited in regions between the pillars and parts 915$b$ being formed on the top surface of the pillars. The parts of the conductive layer 915$a$ between the pillars serve as cathodes. The intersections of the cathodes and anodes form organic LED pixels.

The process continues to complete the OLED device. For example, a cavity cap is mounted on the substrate to encapsulate the device and bond pads are formed to provide electrical access to the OLED pixels.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for forming an OLED device comprising:
    forming a device layer on a substrate having an active region defined thereon in which pixels are formed;
    patterning the device layer to form pillars along a first direction on the substrate, wherein the pillars comprise a tapered profile, and grooves between the pillars, the pillars extend outside the active region to prevent electrical shorting;
    coating the substrate with a solution comprising an organic functional material dissolved in a solvent, the pillars are inert to the solvent;
    removing to solvent to form an organic functional layer; and
    depositing a conductive layer in the electrode region on the substrate, wherein the tapered profile of the pillars separate the conductive layer into first and second distinct portions.

2. The method of claim 1 wherein a distance D is provided between the edge of the active region and ends of the grooves.

3. The method of claim 2 wherein D is at least 300 $\mu$m.

4. The method of claim 2 further comprises mounting a cap on the substrate to hermetically seal the OLED device.

5. The method of claim 4 wherein the substrate comprises a flexible substrate.

6. The method of claim 5 wherein the substrate comprises electrodes in a second direction on a surface thereof.

7. The method of claim 6 wherein the functional organic material comprises a conjugated polymer dissolved in a solvent.

8. The method of claim 1 wherein the device layer comprises a photosensitive device layer, the photosensitive layer is patterned by exposing and developing the photosensitive device layer.

9. The method of claim 8 wherein the photosensitive layer comprises a positive photosensitive layer, wherein exposed portions of the photosensitive layer are removed during developing.

10. The method of claim 9 wherein exposing comprises successively exposing the photosensitive layer with electrons or charged particles having different energies which have different penetration depths to form pillars with the tapered profile during developing.

11. The method of claim 8 comprises curing the pillars to render the pillars inert against the solvent.

12. A method for forming an OLED device comprising:
forming a device layer on a substrate having an active region defined thereon in which pixels are formed;
patterning the device layer to form pillars along a first direction on the substrate, wherein the pillars comprise a tapered profile, and grooves between the pillars, the pillars extend outside the active region to edges of the substrate to prevent electrical shorting;
coating the substrate with a solution comprising an organic functional material dissolved in a solvent, the pillars are inert to the solvent;
removing the solvent to form an organic functional layer; and
depositing a conductive layer on the substrate, wherein the tapered profile of the pillars separate the conductive layer into first and second distinct portions.

13. The method of claim 12 further comprises mounting a cap on the substrate to hermetically seal the OLED device.

14. The method of claim 12 wherein the substrate comprises a flexible substrate.

15. The method of claim 12 wherein the substrate comprises electrodes in a second direction on a surface thereof.

16. The method of claim 12, 13, 14 or 15 wherein the functional organic material comprises a conjugated polymer dissolved in a solvent.

17. The method of claim 16 wherein the device layer comprises a photosensitive device layer, the photosensitive layer is patterned by exposing and developing the photosensitive device layer.

18. The method of claim 17 wherein the photosensitive layer comprises a positive photosensitive layer, wherein exposed portions of the photosensitive layer are removed during developing.

19. The method of claim 17 wherein exposing comprises successively exposing the photosensitive layer with electrons or charged particles having different energies which have different penetration depths to form pillars with the tapered profile during developing.

20. The method of claim 19 comprises curing the pillars to render the pillars inert against the solvent.

21. A method for forming an OLED device comprising:
forming a device layer on a substrate having an active region defined thereon in which pixels are formed;
patterning the device layer to form pillars along a first direction on the substrate, wherein the pillars comprise a tapered profile and grooves between the pillars, the pillars extend outside the active region to prevent electrical shorting;
forming an organic functional material on the substrate; and
depositing a conductive layer in the electrode region on the substrate, wherein the tapered profile of the pillars separate the conductive layer into first and second distinct portions.

22. The method of claim 21 wherein grooves extend outside the active region to the edges of the substrate.

23. The method of claim 22 wherein forming an organic functional material on the substrate comprises coating the substrate a solution comprising the organic functional material dissolved in a solvent and wherein the pillars are inert to the solvent.

24. The method of claim 22 wherein:
the device layer comprises a photosensitive material; and
the device layer after the pillars are formed is cured to render the pillars inert to the solvent.

25. The method of claim 21 wherein forming an organic functional material on the substrate comprises coating the substrate a solution comprising the organic functional material dissolved in a solvent and wherein the pillars are inert to the solvent.

26. The method of claim 25 wherein:
the device layer comprises a photosensitive material; and
the device layer after the pillars are formed is cured to render the pillars inert to the solvent.

27. The method of claim 21 wherein:
the device layer comprises a photosensitive material; and
the device layer after the pillars arc formed is cured to render the pillars inert to the solvent.

* * * * *

UNITED STATES PATENT AND TRADEMARK OFFICE
CERTIFICATE OF CORRECTION

PATENT NO. : 6,784,009 B2
DATED : August 31, 2004
INVENTOR(S) : Hool Bin Lim, Hagen Klausmann and Bernd Fritz It is certified that error appears in the above-identified patent and that said Letters Patent is hereby corrected as shown below:

Column 6,
Line 35, "removing to solvent" should read -- removing the solvent --.

Signed and Sealed this

Fourth Day of January, 2005

JON W. DUDAS
*Director of the United States Patent and Trademark Office*